(12) United States Patent
Odagiri et al.

(10) Patent No.: US 8,968,475 B2
(45) Date of Patent: Mar. 3, 2015

(54) SUBSTRATE PROCESSING APPARATUS

(75) Inventors: Masaya Odagiri, Nirasaki (JP); Shigeki Tozawa, Nirasaki (JP); Hajime Ugajin, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 463 days.

(21) Appl. No.: 13/349,190

(22) Filed: Jan. 12, 2012

(65) Prior Publication Data
US 2012/0180883 A1  Jul. 19, 2012

(30) Foreign Application Priority Data
Jan. 13, 2011  (JP) ................... 2011-004781

(51) Int. Cl.
*C23C 16/00* (2006.01)
*H01L 21/67* (2006.01)

(52) U.S. Cl.
CPC .... *H01L 21/67173* (2013.01); *H01L 21/67017* (2013.01); *H01L 21/6719* (2013.01)
USPC ...................... 118/715; 156/345.29

(58) Field of Classification Search
USPC .............. 137/334; 156/345.29; 118/715, 725
See application file for complete search history.

(56) References Cited

U.S. PATENT DOCUMENTS

| | | | | |
|---|---|---|---|---|
| 5,441,568 A * | 8/1995 | Cho et al. ...................... | 118/715 |
| 6,120,605 A * | 9/2000 | Sato ............................... | 118/715 |
| 6,176,969 B1 * | 1/2001 | Park et al. ................. | 156/345.29 |
| 6,206,971 B1 * | 3/2001 | Umotoy et al. ............... | 118/715 |
| 7,648,610 B2 * | 1/2010 | Komiya et al. .......... | 156/345.29 |
| 2004/0063333 A1 * | 4/2004 | Saigusa et al. ................. | 438/758 |
| 2006/0160359 A1 * | 7/2006 | Kasai et al. .................... | 438/680 |
| 2006/0165904 A1 * | 7/2006 | Ohara ........................ | 427/372.2 |
| 2007/0128880 A1 * | 6/2007 | Kitagawa et al. ............. | 438/758 |
| 2010/0081284 A1 * | 4/2010 | Balakrishna et al. ......... | 438/710 |
| 2010/0279008 A1 * | 11/2010 | Takagi ....................... | 427/248.1 |

FOREIGN PATENT DOCUMENTS

| | | |
|---|---|---|
| JP | 2-37717 A | 2/1990 |
| JP | 5-4466 U | 1/1993 |
| JP | 10-074738 A | 3/1998 |
| JP | 2000-30894 A | 1/2000 |
| KR | 10-2005-0105249 A | 11/2005 |

* cited by examiner

*Primary Examiner* — Kevin Murphy
(74) *Attorney, Agent, or Firm* — Nath, Goldberg & Meyer; Jerald L. Meyer; Katelyn J. Bernier

(57) ABSTRACT

A substrate processing apparatus, which is provided with a processing chamber configured to process a substrate and capable of being depressurized, includes a substrate placing table configured to place a substrate; a baffle plate disposed around the substrate placing table so as to divide an inside of the processing chamber into a processing space and an exhaust space; and an exhaust port configured to exhaust the inside of the processing chamber. A gap is formed between the substrate placing table and the baffle plate and a plurality of communication holes are formed in the baffle plate so that the processing space and the exhaust space communicate with each other.

7 Claims, 5 Drawing Sheets

SUBSTRATE PROCESSING APPARATUS

CROSS-REFERENCE TO RELATED APPLICATION

This application claims the benefit of Japanese Patent Application No. 2011-004781, filed on Jan. 13, 2011, in the Japan Patent Office, the disclosure of which is incorporated herein in its entirety by reference.

TECHNICAL FIELD

The present disclosure relates to a substrate processing apparatus used in a micro fabrication field, for example, a semiconductor manufacturing process.

BACKGROUND

In processing a substrate (hereinafter, also referred to as a wafer) in a semiconductor manufacturing process and the like performed in a vacuum, the process needs to be uniformly performed over the whole wafer in, for example, a chemical treatment chamber for performing a chemical treatment on the wafer. Accordingly, developing various technologies is required for adjusting a temperature in order to secure a uniform temperature on a surface of the wafer and for securing a uniform gas flow on the wafer.

In the related art, the following single wafer-type plasma processing apparatus has been proposed, which processes one sheet of wafers at a time. That is, a baffle plate is provided in the plasma processing apparatus so as to divide the inside of the chamber into a reactant gas introducing side and a reactant gas exhausting side. Exhaust regulating holes are formed in the baffle plate and a cross sectional area of the flow path of each exhaust regulating hole is varied depending on its position to thereby secure a uniform flow of the reactant gas. Further, a two wafer-type plasma processing apparatus provided with an exhaust plate has been proposed. The exhaust plate is disposed in the chamber such that a front surface side of a substrate is separated from a back surface side thereof. Exhaust holes are formed in the exhaust plate at predetermined distances from each other to thereby control the exhaust.

In the plasma processing apparatuses described above, however, a gas flow pattern on spots of a substrate to be processed, located in the vicinity of portions of the baffle plate where communication holes (corresponding to regulating holes and exhaust holes) are formed, is different from a gas flow pattern on other spots of the substrate to be processed, located in the vicinity of portions of the baffle plate where no communication holes are formed. Therefore, it is difficult to sufficiently secure uniformity of gas flow on the substrate to be processed.

SUMMARY

The present disclosure provides some embodiments of a substrate processing apparatus capable of securing a uniform gas flow on a substrate to thereby perform a uniform substrate processing.

According to one embodiment of the present disclosure, a substrate processing apparatus, which is provided with a processing chamber configured to process a substrate and capable of being depressurized, includes a substrate placing table configured to place a substrate thereon; a baffle plate disposed around the substrate placing table so as to divide an inside of the processing chamber into a processing space and an exhaust space; and an exhaust port configured to exhaust the inside of the processing chamber, wherein a gap is formed between the substrate placing table and the baffle plate and a plurality of communication holes are formed in the baffle plate so that the processing space and the exhaust space communicate with each other.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
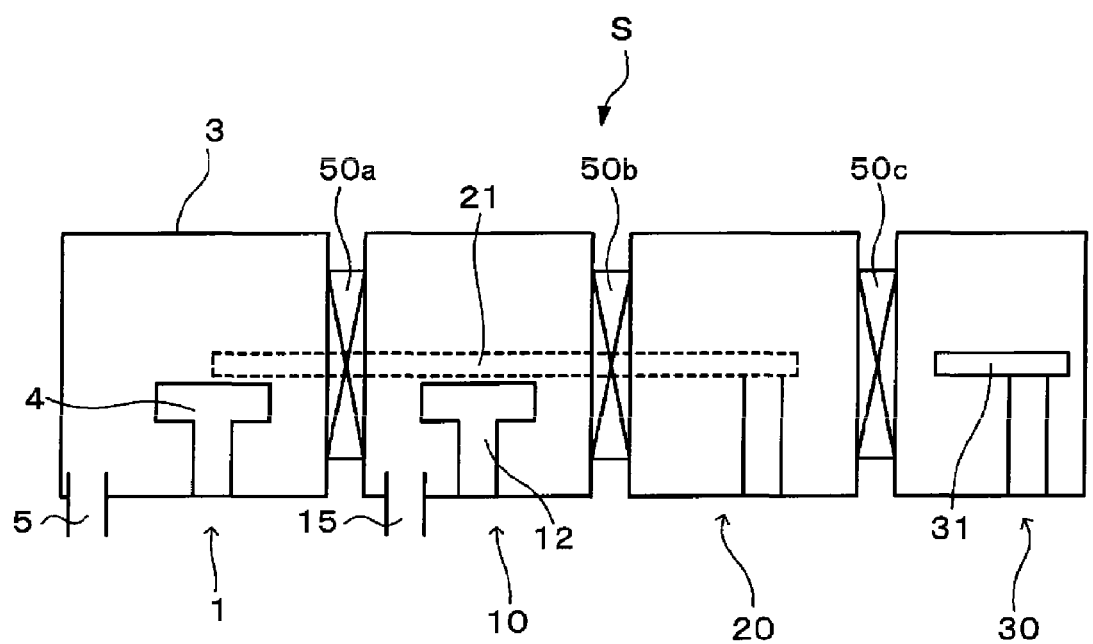
FIG. 1 is a schematic side sectional view of a substrate processing system.

Embodiments of the present disclosure will now be described in detail with reference to the drawings. In the specification and drawings, like reference numerals will be assigned to like parts having substantially the same functions and duplicate descriptions thereof will be omitted. In the following embodiments, a substrate processing system S and a substrate processing apparatus 1 capable of disposing and processing two sheets of, for example, circular substrates W at a time will be described by way of example.

Figure 2:
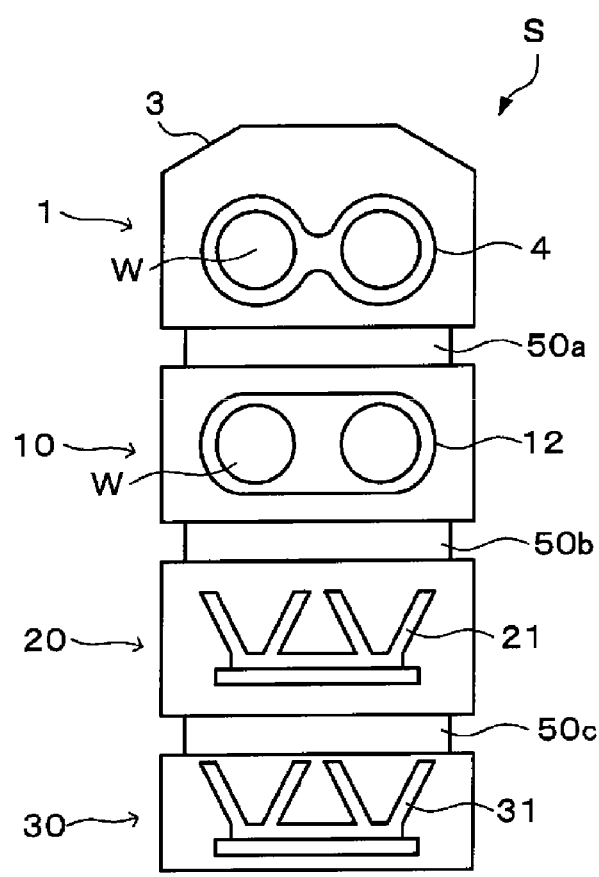
FIG. 2 is a schematic plan sectional view of the substrate processing system.

FIG. 1 is a schematic side sectional view of a substrate processing system S provided with a substrate processing apparatus 1 in accordance with one embodiment of the present disclosure, and FIG. 2 is a schematic plan sectional view of the substrate processing system S. FIG. 1 does not illustrate substrates W, while FIG. 2 illustrates the substrates W being placed in the substrate processing apparatus 1 and a heating apparatus 10 to be described below. Further, a baffle plate 60 (to be described later) is not shown in FIGS. 1 and 2. The substrate processing system S is configured as a chemical treatment system. As shown in FIGS. 1 and 2, the substrate processing system S is configured such that the substrate processing apparatus 1, the heating apparatus 10, a transfer pressure regulating apparatus 20 and a transfer apparatus 30 are sequentially disposed in a line (from left to right in FIG. 1), the substrate processing apparatus 1 being coupled with the heating apparatus 10, the heating apparatus 10 being coupled with the transfer pressure regulating apparatus 20, and the transfer pressure regulating apparatus 20 being coupled with the transfer apparatus 30. The substrate processing apparatus 1 is coupled with the heating apparatus 10 via a gate valve 50a, the heating apparatus 10 is coupled with the transfer pressure regulating apparatus 20 via a gate valve 50b, and the transfer pressure regulating apparatus 20 is coupled with the transfer apparatus 30 via a gate valve 50c.

The transfer pressure regulating apparatus 20 is configured to carry the substrates W into the substrate processing apparatus 1 and the heating apparatus 10 from the outside of the substrate processing system S without changing the internal pressures of the depressurized apparatuses. Specifically, the gate valve 50b is closed (so that the insides of the transfer pressure regulating apparatus 20 and the heating apparatus 10 are spatially separated from each other) and then the pressure inside of the transfer pressure regulating apparatus 20 is changed to an atmospheric pressure. Thereafter, the substrates W are carried into the transfer pressure regulating apparatus 20 from the transfer apparatus 30 where the pressure inside thereof is at an atmospheric pressure. Subsequently, the gate valve 50c is closed and then the pressure in the transfer pressure regulating apparatus 20 is regulated to the same pressure as those in the substrate processing apparatus 1 and the heating apparatus 10. Afterwards, the gate valves 50a and 50b are opened to carry the substrates W into the substrate processing apparatus 1 from the transfer pressure regulating apparatus 20. In this way, the substrates W can be carried into the substrate processing apparatus 1 and the heating apparatus 10 without changing the internal pressures thereof.

Transfer of the substrates W between the transfer apparatus 30 and the transfer pressure regulating apparatus 20 is performed by an arm 31 provided in the transfer apparatus 30. Further, transfers of the substrates W between the transfer pressure regulating apparatus 20 and the substrate processing apparatus 1, between the substrate processing apparatus 1 and the heating apparatus 10, and between the heating apparatus 10 and the transfer pressure regulating apparatus 20 are performed by an arm 21 provided in the transfer pressure regulating apparatus 20. In the present embodiment, as shown in FIG. 2, the arms 21 and 31 are configured to hold and support two sheets of the substrates W and to be extensible/contractible, thereby transferring the two sheets of the substrates W at the same time. FIG. 1 illustrates the arm 21 being extended to the substrate processing apparatus 1 (by broken lines in FIG. 1).

As shown in FIGS. 1 and 2, the substrate processing apparatus 1 includes a processing chamber 3. In the processing chamber 3, a substrate placing table 4 is provided to place thereon two sheets of the substrates W next to each other in an approximately horizontal direction. The substrate placing table 4 is configured to be provided with a lifter pin (not shown), by which the substrates W are placed on the substrate placing table 4. An exhaust port 5 is disposed in a bottom surface of the processing chamber 3, and more particularly, in an opposite side of the gate valve 50a side (i.e., in a front end of the substrate processing system S) so as to exhaust the inside of the processing chamber 3. When viewed from above, the exhaust port 5 is formed in an eccentric position from the center of the substrate placing table 4. The exhaust port 5 is connected with, for example, a vacuum pump (not shown) or the like.

Provided in the heating apparatus 10 is a heating table 12 configured to load the two sheets of the substrates W next to each other thereon and heat the substrates W. The heating table 12 provided with a heater (not shown) is configured to heat the substrates W up to a desired temperature. Further, the heating apparatus 10 is configured to be depressurized by a vacuum pump (not shown) communicating with an exhaust port 15.

Figure 3:
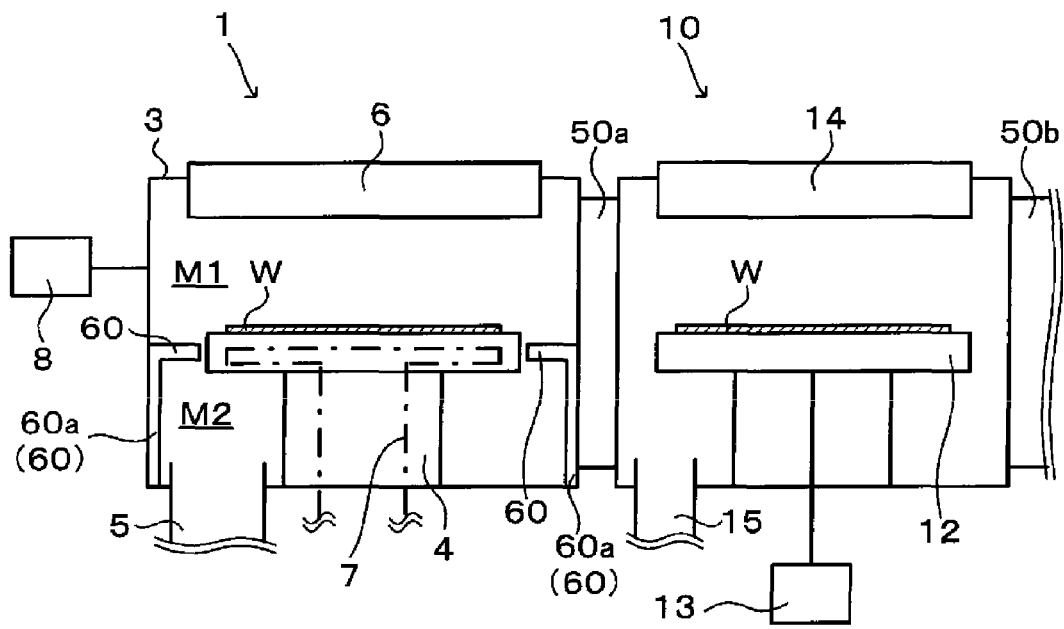
FIG. 3 is a side sectional view of a substrate processing apparatus and a heating apparatus.

In the following, the substrate processing apparatus 1 and the heating apparatus 10 will now be described in detail with reference to FIG. 3. FIG. 3 is a side sectional view of the substrate processing apparatus 1 and the heating apparatus 10 being connected with each other through the gate valve 50a. In FIG. 3, the substrates W are placed on the substrate placing table 4 and the heating table 12.

As shown in FIG. 3, the substrate placing table 4 is installed in the processing chamber 3 so as to load the substrates W thereon. Formed in the substrate placing table 4 is a temperature regulation flow path 7 (by alternating short and long dash lines in FIG. 3) communicating with a temperature regulating medium supply unit (not shown). In a ceiling part of the processing chamber 3, a gas supply unit 6 is installed to supply a process gas (hereinafter, also referred to as a reactant gas or a gas) for substrate processing to the processing chamber 3. The gas supply unit 6 has, for example, a shower shape and injects the process gas from the ceiling part of the processing chamber 3 to thereby perform the substrate processing. In this embodiment, as an example of the process gas used in a surface treatment of the substrate W, an HF gas and an $NH_3$ gas are employed to process an oxide film such as a $SiO_2$ film (silicon oxide film) formed on the surface of the substrate W. As an example of the substrate processing, a chemical treatment (i.e., treatment using chemical reaction) as an alteration process of the $SiO_2$ film is performed.

A temperature control unit 8 is connected with the processing chamber 3. Through operation of the temperature control unit 8, the temperature of the processing chamber 3 is controlled freely. The temperature of the substrate W placed on the substrate placing table 4 is adjusted to a predetermined temperature by heat transmission from the substrate placing table 4 and the processing chamber 3. In other words, it is possible to heat or cool the substrate W to a predetermined temperature (i.e., to a process temperature) by regulating the temperature of a temperature regulating medium flowing through the temperature regulating flow path 7 and controlling the temperature control unit 8 which controls the temperature of the processing chamber 3. Since the temperature of the processing chamber 3 is controlled by the temperature control unit 8, the temperature of a baffle plate 60 installed to be in contact with the processing chamber 3 is also controlled to a predetermined temperature by the temperature control unit 8. The baffle plate 60 will be described later.

As shown in FIG. 1, the exhaust port 5 is disposed in the bottom surface of the processing chamber 3, and more particularly, in the opposite side of where the gate valve 50a is installed (i.e., in the front end of the substrate processing system S) so as to exhaust the inside of the processing chamber 3. As described above, the exhaust port 5 is formed in the eccentric position from the center of the substrate placing table 4. Further, the inside of the processing chamber 3 can be depressurized (or vacuumized) by driving the vacuum pump communicating with the exhaust port 5.

Figure 4:
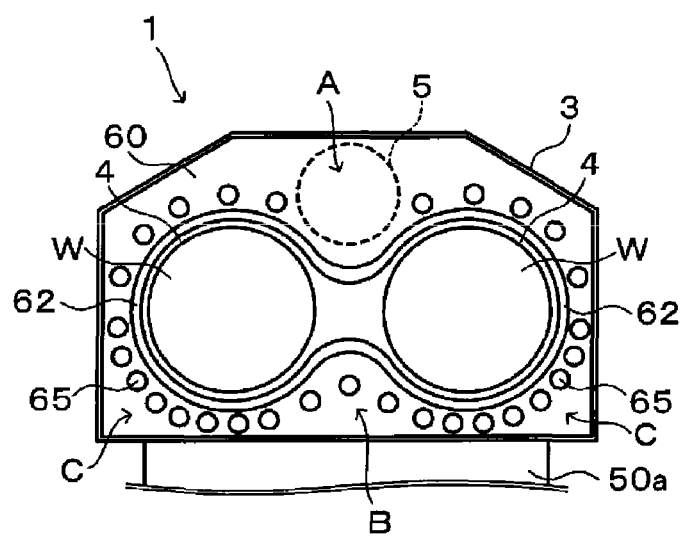
FIG. 4 is a schematic plan view of a substrate placing table and a baffle plate.

In the processing chamber 3, the baffle plate 60 is installed to surround a circumference of the substrate placing table 4. A gap 62 (as shown in FIG. 4) of a predetermined width is formed between the substrate placing table 4 and the baffle plate 60. As shown in FIG. 3, the baffle plate 60 is arranged to surround the whole circumference of the substrate placing table 4. The baffle plate 60 is configured to divide the inside of the processing chamber 3 into a processing space M1 positioned higher than the substrate placing table 4 and an exhaust space M2 positioned lower than the substrate placing table 4.

As shown in FIG. 3, the baffle plate 60 includes a foot section 60a elongated along an inner wall of the processing chamber 3 in a direction toward the bottom part of the chamber. The foot section 60a is elongated to the bottom part of the processing chamber 3 with a leading end thereof being fixed to the bottom part of the processing chamber 3. With this configuration, the aforementioned exhaust space M2 is surrounded with the lower surface of the substrate placing table 4, the baffle plate 60, and the bottom surface of the processing chamber 3.

As such, by configuring the baffle plate 60 to include the foot section 60a, hermeticity of the exhaust space M2 is improved so that exhaust through the exhaust port 5 is sufficiently performed in the exhaust space M2. As a result, the inside of the processing chamber 3 is exhausted efficiently.

FIG. 4 is a schematic plan view illustrating the baffle plate 60 and the substrates W placed on the substrate placing table 4 in the processing chamber. In FIG. 4, the location of the exhaust port 5 is indicated by broken lines. Viewed from above, the baffle plate 60 is shaped such that it surrounds the substrate placing table 4 where two sheets of the substrates W are placed, as shown in FIG. 4. Also, viewed from above, the baffle plate 60 covers the portion other than the substrates W and the substrate placing table 4 in the processing chamber 3. The gap 62 of a predetermined width is formed (in an approximately "8" shape) between an outer circumference of the substrate placing table 4 and an inner circumference of the baffle plate 60.

Formed in the baffle plate 60 are a plurality of communication holes 65 having a predetermined diameter. The diameters of the communication hole 65 are identical. In the present embodiment, the plurality of communication holes 65 are arranged in the vicinity of the gap 62 to surround the substrates W, as shown in FIG. 4. In the baffle plate 60, the distances between the communication holes 65 are not equal and no communication holes 65 are formed in the portion directly above the exhaust port 5 (i.e., a portion "A" in FIG. 4). In other words, the density of the communication holes 65 in the portion of the baffle plate 60 located directly above the exhaust port 5 is lower than the density of the communication holes 65 in the other portions of the baffle plate 60.

Further, in the baffle plate 60 in accordance with the present embodiment, the density of the communication holes 65 at a center portion of a part facing the exhaust port 5 via the substrate placing table 4 in a plan view (i.e., a center portion of a part located in the vicinity of the gate valve 50a, a portion "B" in FIG. 4) is lower than the density of the communication holes 65 in a peripheral portion of the part facing the exhaust port 5 via the substrate placing table 4 in a plan view (i.e., a peripheral portion of the part located in the vicinity of the gate valve 50a, a portion "C" in FIG. 4).

Temperatures of the substrate placing table 4 and the baffle plate 60 are adjusted to different temperatures from each other. Specifically, the temperature of the substrate placing table 4 is adjusted to a temperature as required to regulate the substrates W to a predetermined temperature. The temperature of the baffle plate 60 is adjusted to a temperature at which a gas of reaction products generated during the substrate processing (to be described later) is kept from adhering thereto (i.e., to a reactant adherence preventing temperature).

Figure 5:
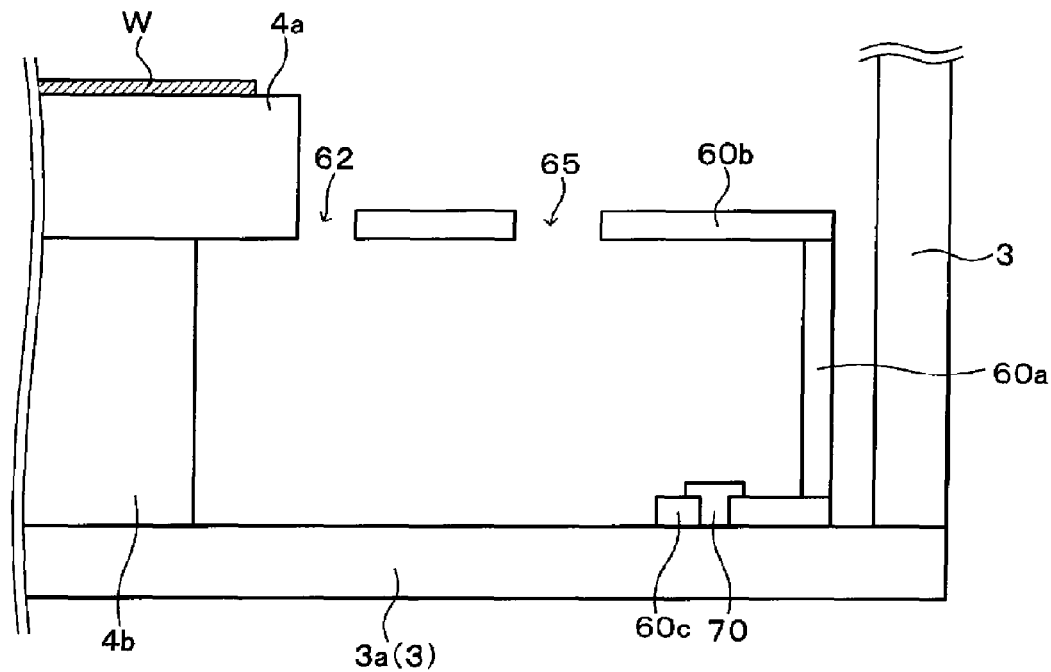
FIG. 5 is a schematic sectional view showing an exhaust space surrounded with the substrate placing table, the baffle plate, a foot section and a bottom surface of a processing chamber.

In the following, the above-described substrate placing table 4, baffle plate 60, foot section 60a, gap 62 and communication holes 65 will be described in more detail with reference to FIG. 5. FIG. 5 is a schematic side sectional view showing the exhaust space M2 surrounded with the substrate placing table 4, the baffle plate 60, the foot section 60a and the bottom surface (hereinafter, also referred to as a bottom plate 3a) of the processing chamber 3.

As shown in FIG. 5, the substrate placing table 4 includes a table section 4a and a support section 4b. The table section 4a is configured to load the substrates W thereon. The support section 4b is configured to be fixed to the bottom plate 3a of the processing chamber 3 and support the table section 4a. The baffle plate 60 includes a plate section 60b configured to extend around the table section 4a and have the communication holes 65 formed therein. The baffle plate 60 is disposed such that a side surface of an inner circumferential side of the plate section 60b thereof faces a side surface of the table section 4a at a predetermined distance therebetween. The gap 62 is formed between the side surface of the inner circumferential side of the plate section 60b and the side surface of the table section 4a. In this configuration, in the case of adjusting the temperatures of the baffle plate 60 and the substrates W to different temperatures, the baffle plate 60 and the substrates W may preferably be disposed at a distance from each other by locating an upper surface of the plate section 60b lower than an upper surface of the table section 4a in order to prevent heat transmission therebetween.

As shown in FIG. 5, an installation section 60c is provided at a leading end (lower end) of the foot section 60a. The installation section 60c is fixed to the bottom plate 3a of the processing chamber 3 by means of a screw 70 to thereby keep the baffle plate 60 in contact with the bottom plate 3a. With this configuration, the temperature of the baffle plate 60 can be adjusted by the temperature control unit 8 through heat transmission from the processing chamber 3 via the installation section 60c and the bottom plate 3a.

As shown in FIG. 3, the heating table 12 is installed in the heating apparatus 10 so as to load approximately horizontally and heat two sheets of the substrates W thereon. The heating table 12 has a heater wire (i.e., electrothermal wire, not shown) embedded therein, to which a heater power supply 13 is connected. A purge gas supply unit 14 configured to supply a purge gas, for example, an $N_2$ gas or the like, into the heating apparatus 10 is provided in a ceiling part of the heating apparatus 10. As described above, the exhaust port 15 is installed in the bottom part of the heating apparatus 10 and, by driving the vacuum pump (not shown) communicating with the exhaust port 15, the heating apparatus 10 can be depressurized.

In the substrate processing apparatus 1 and the heating apparatus 10 described above with reference to FIG. 3, the following substrate cleaning process is performed upon the substrate W having, for example, a $SiO_2$ film on the surface thereof. That is, each substrate W is placed such that the surface with the $SiO_2$ film faces upward first and then the substrates W are carried into the transfer pressure regulating apparatus 20 through the gate valve 50c by the arm 31.

Two sheets of the substrates W carried into the transfer pressure regulating apparatus 20 are held and supported in batches by the arm 21 and then the gate valve 50c is closed. Thereafter, the insides of the substrate processing apparatus 1, the heating apparatus 10 and the transfer pressure regulating apparatus 20 are all adjusted to a depressurized (or vacuum) state and then the gate valves 50a and 50b are opened. In this state, the two substrates W are transferred into the substrate processing apparatus 1 by operation of the arm 21. The two substrates W transferred into the substrate processing apparatus 1 are placed on the substrate placing table 4 at the same time. When the transfer of the substrates W is terminated, the arm 21 is received in the transfer pressure regulating apparatus 20 and the gate valves 50a and 50b are individually closed.

Subsequently, as the substrate processing, for example, a process of chemically treating the $SiO_2$ film formed on the surface of the substrate W by using an HF gas and an $NH_3$ gas as process gases (i.e., alteration process) is performed in the substrate processing apparatus 1. This chemical treatment is performed as follows: the substrates W are placed on the substrate placing table 4 in a depressurized state with the respective $SiO_2$ films facing upward, the temperatures of the substrates W are controlled to be at a predetermined temperature, and then a mixed gas of the HF and $NH_3$ gases serving as the process gases is injected from the gas supply unit 6 into the processing chamber 3. Through this chemical treatment, chemical reaction occurs between the $SiO_2$ film and molecules of the HF and $NH_3$ gases to thereby produce reaction products, for example, ammonium fluorosilicate, moisture and the like.

In the above described chemical treatment, it is necessary to flow uniformly the mixed gas of the HF and $NH_3$ gases serving as the process gases on the surface of the substrate W. By making uniform contact with the $SiO_2$ film, the reaction products can be uniformly produced on the surface of the substrate W. In the substrate processing apparatus 1 in accordance with the present embodiment, the inside of the processing chamber 3 is divided into the processing space M1 and the exhaust space M2 by the baffle plate 60 installed around the substrate placing table 4. The exhaust port 5 is formed in the exhaust space M2 and the exhaust space M2 is a highly hermetic space surrounded with the lower surface of the substrate placing table 4, the baffle plate 60 (the foot section 60a) and the bottom surface of the processing chamber 3. With this configuration, the process gas in the processing space M1 only flows out to the exhaust space M2 through the communication holes 65 formed in the baffle plate 60 and the gap 62 formed between the baffle plate 60 and the substrate placing table 4. The process gas flowing into the exhaust space M2 is exhausted through the exhaust port 5.

As described above, in the baffle plate 60, no communication holes 65 are formed in the portion directly above the exhaust port 5. In other words, the density of the communication holes 65 in the portion of the baffle plate 60 located directly above the exhaust port 5 is lower than the density of the communication holes 65 in the other portions of the baffle plate 60. The portion directly above the exhaust port 5 is so close to the exhaust port 5 that a large amount of the process gas may be exhausted compared with the other portions. However, by installing the baffle plate 60 having no communication holes 65 in the portion directly above the exhaust port 5, process gas flowing out from the processing space M1 to the exhaust space M2 in the portion directly above the exhaust port 5 in a large amount compared with other portions can be prevented. As such, it is possible to avoid variation of the process gas outflow from the processing space M1 to the exhaust space M2 depending on the location, thereby preventing a non-uniform flow of the process gas on the surface of the substrate W.

Further, in the baffle plate 60, the density of the communication holes 65 in the center portion of the part facing the exhaust port 5 via the substrate placing table 4 in a plan view (i.e., the center portion of the part located in the vicinity of the gate valve 50a, the portion "B" in FIG. 4) is lower than the density of the communication holes 65 in the peripheral portion of the part facing the exhaust port 5 via the substrate placing table 4 in a plan view (i.e., the peripheral portion of the part located in the vicinity of gate valve 50a, the portion "C" in FIG. 4). Thus, in the processing space M1 (in particular, in the vicinity of the upper surface of the substrate placing table 4), the process gas is apt to stay in the center portion of the part located in the vicinity of the gate valve 50a rather than in the peripheral portion thereof. Also, the gas supply per unit area on the substrate W tends to be reduced in the center portion of the part located in the vicinity of the gate valve 50a compared with other portions, so that the percentage of the amount of the process gas which contributes to the substrate processing (i.e., the chemical treatment) out of the amount of the supplied process gas is higher in the center portion of the part located in the vicinity of the gate valve 50a. As such, on the surface of the substrate W, a uniform supply of the process gas contributing to the substrate processing (i.e., the chemical treatment) per unit area is achieved over the center portion (the portion "B") and the peripheral portion (the portion "C") of the part located in the vicinity of the gate valve 50a. As a result, the substrate processing (i.e., the chemical treatment) is uniformly performed on the substrate W.

Subsequently, the substrates W for which the chemical treatment was performed are transferred into the heating apparatus 10 by the arm 21 through the gate valve 50a, with the respective processed surfaces facing upward. The substrates W transferred into the heating apparatus 10 are placed on the heating table 12. Thereafter, the heating table 12 on which the substrates W are placed is heated up to the predetermined temperature by operation of the heater 13, which also heats the substrates W placed on the heating table 12. By this heating process, the reaction products generated on the surface of the substrates W by the chemical treatment are vaporized and removed from the surface of the substrates W (heating process). The vaporized reaction products are discharged from the heating apparatus 10 by introduction of the purge gas into the heating apparatus 10 by the purge gas supply unit 14 and exhausted from the exhaust port 15.

Once the heating process is completed, the substrates W are transferred into the transfer pressure regulating apparatus 20 by the arm 21 through the gate valve 50b. Thereafter, the gate valve 50b is closed, and then the internal pressures of the transfer apparatus 30 and the transfer pressure regulating apparatus 20 are adjusted to the same pressure in the same manner as when the substrates W are carried into the apparatus. After that, the gate valve 50c is opened and the substrates W are removed from the transfer pressure regulating apparatus 20 by the arm 31.

By the above-described processes, a series of the substrate cleaning process in the substrate processing system S is completed. After the substrate cleaning process is completed in the substrate processing system S, the substrates W are carried into, for example, a film forming apparatus such as a CVD apparatus in another processing system and then a film forming process employing, for example, a CVD method is performed upon the substrates W.

In the substrate processing system S in accordance with the present embodiment, particularly in the substrate processing apparatus 1, the baffle plate 60 is installed around the substrate placing table 4 installed in the processing chamber 3 so as to divide the inside of the processing chamber 3 into the processing space M1 (the front surface side of the substrate W) and the exhaust space M2 (the back surface side of the substrate W). Further, a plurality of the communication holes 65 of a predetermined diameter are formed in the baffle plate 60 and the gap 62 is formed at a predetermined width between the baffle plate 60 and the substrate placing table 4. With this configuration, the gas outflow from the processing space M1 to the exhaust space M2 occurs only through the communication holes 65 and the gap 62. As such, the gas outflow from the processing space M1 to the exhaust space M2 is controlled only by the arrangement configuration (i.e., distribution) of the communication holes 65, the width of the gap 65 and the distance between the communication holes 65 and the gap 62.

In the substrate processing apparatus 1 in accordance with the present embodiment, the exhaust port 5 is formed characteristically in an eccentric position from the center of the substrate placing table 4 so that the density of the communication holes 65 in the portion of the baffle plate 60 directly above the exhaust port 5 is lower than the density of the communication holes 65 in other portions of the baffle plate 60. As a result, the process gas flowing out from the process space M1 to the exhaust space M2 in the portion directly above the exhaust port 5 in a large amount compared with the other portions is prevented. As such, it is possible to avoid variation of the process gas outflow from the processing space M1 to the exhaust space M2 depending on the location, thereby preventing a non-uniform flow of the process gas on the surface of the substrate W.

Further, the density of the communication holes 65 in the center portion of the part facing the exhaust port 5 via the substrate placing table 4 in a plan view (i.e., the center portion of the part located in the vicinity of the gate valve 50a, the portion "B" in FIG. 4) is lower than the density of the communication holes 65 in the peripheral portion of the part facing the exhaust port 5 via the substrate placing table 4 in a plan view (i.e., the peripheral portion of the part located in the vicinity of gate valve 50a, the portion "C" in FIG. 4). Thus, in the center portion of the part located in the vicinity of the gate valve 50a (the portion "B") where the gas supply per unit area on the substrate W tends to be reduced compared with the other portions, the percentage of the amount of the process gas which contributes to the substrate processing (i.e., the chemical treatment) out of the amount of supplied process gas becomes higher. Thus, a uniform supply of the process gas contributing to the substrate processing (i.e., the chemical treatment) per unit area is achieved over the center portion (the portion "B") and the peripheral portion (the portion "C") of the part located in the vicinity of the gate valve 50a. As a result, the substrate processing (i.e., the chemical treatment) is uniformly performed on the substrate Further, the gap 62 is formed between the baffle plate 60 and the substrate placing table 4, through which gas flows from the processing space M1 to the exhaust space M2. With this configuration, a uniform gas flow on the surface of the substrate W can be realized.

In the following, a principle of the uniform gas flow on the surface of the substrate W by formation of the gap 62 will be explained in detail with reference to FIGS. 6 and 7.

Figure 6:
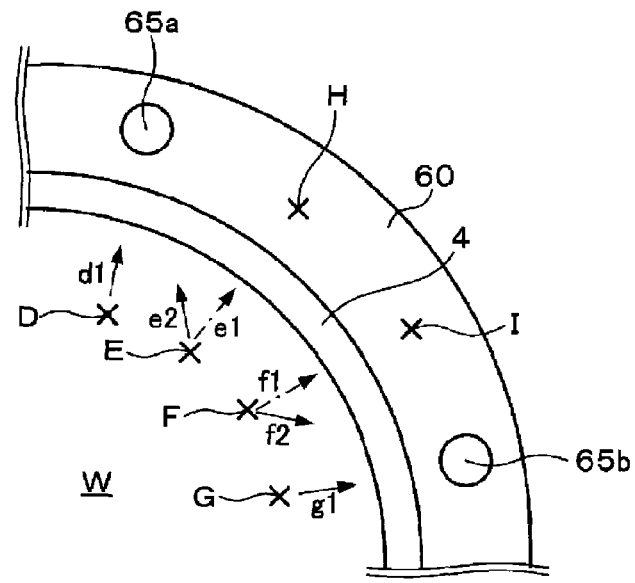
FIG. 6 a schematic diagram showing a gas flow in a configuration without forming a gap between the baffle plate and the substrate placing table.
Figure 7:
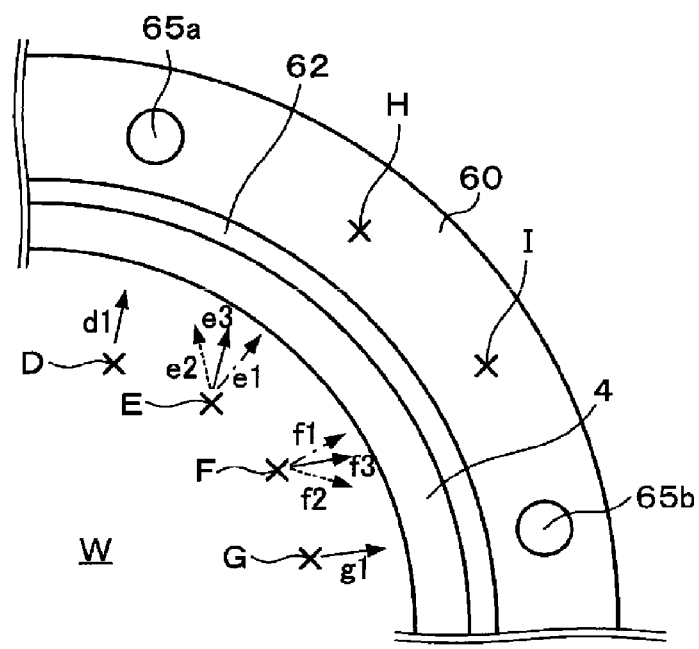
FIG. 7 is a schematic diagram showing a gas flow in a configuration with a gap formed between the baffle plate and the substrate placing table.

FIG. 6 illustrates schematically a gas flow in a configuration without forming the gap between the baffle plate 60 and the substrate placing table 4, whereas FIG. 7 Illustrates schematically a gas flow in a configuration with the gap 62 formed between the baffle plate 60 and the substrate placing table 4. FIGS. 6 and 7 present an enlarged view of an adjoining part of the baffle plate 60 and the substrate W being placed on the substrate placing table 4. In FIGS. 6 and 7, a communication hole 65a and a communication hole 65b are neighboring with each other among the plurality of communication holes 65 and spots D, E, F and G are the spots on the substrate W.

As shown in FIGS. 6 and 7, a spot D is located in the vicinity of the communication hole 65a, specifically, on a line passing through the center of the communication hole 65a and extending perpendicularly to the edge of the substrate W. A spot G is located in the vicinity of the communication hole 65b, specifically, on a line passing through the center of the communication hole 65b and extending perpendicularly to the edge of the substrate W. Further, a spot E is located in the vicinity of a spot H, specifically, on a line passing through the spot H and extending perpendicularly to the edge of the substrate W, the spot H being arranged between the communication holes 65a and 65b and located closer to the communication hole 65a. A spot F is located in the vicinity of a spot I, specifically, on a line passing through the spot I and extending perpendicularly to the edge of the substrate W, the spot I being arranged between the communication holes 65a and 65b and located closer to the communication hole 65b.

In relation with the gas flowing direction at the spot D, gas tends to flow in a direction toward the communication hole 65a which is the closest communication hole from the spot D as indicated by an arrow d1, as shown in FIGS. 6 and 7. In the same manner, gas at the spot G tends to flow in a direction toward the closest communication hole 65b from the spot G, as indicated by an arrow g1. The direction of the arrow d1 is the direction of the shortest route from the spot D to the edge of the substrate W and, in case of using a circular substrate W, the direction of a line passing through the center of the substrate and the spot D. In the same manner, the direction of the arrow g1 is the direction of the shortest route from the spot G to the edge of the substrate W and, in case of using a circular substrate W, the direction of a line passing through the center of the substrate and the spot G.

In terms of the uniformity of the gas flow at each of the spots on the substrate W, it is optimal for the gas at the spots E and F to flow respectively in the directions of the shortest routes from the spots E and F to the edge of the substrate W (in the directions of arrows e1 and f1 indicated by alternating short and long dash lines in the drawings, i.e., in the directions from the spot E to the spot H and from the spot F to the spot I), so that the gas flows at the spots E and F in the same manner as the spots D and G. However, in the configuration without forming the gap 62 between the baffle plate 60 and the substrate placing table 4, the gas at the spot E tends to flow in the direction of the closest communication hole 65a from the spot E, as indicated by the arrow e2 shown in FIG. 6. Likewise, in the configuration without forming the gap 62 between the baffle plate 60 and the substrate placing table 4, the gas at the spot F tends to flow in the direction of the closest communication hole 65b from the spot F, as indicated by the arrow f2.

On the contrary, in the configuration with the gap 62 formed between the baffle plate 60 and the substrate placing table 4, the gas on the substrate W is exhausted through the gap 62 as well as the communication holes 65 so that the gas at the spot E flows in a direction close to the direction of the arrow e1 rather than in the direction of the arrow e2, as indicated by the arrow e3 in FIG. 7. Likewise, in the configuration with the gap 62 formed between the baffle plate 60 and the substrate placing table 4, the gas at the spot F flows in a direction close to the direction of the arrow f1 rather than in the direction of the arrow f2, as indicated by an arrow f3 in FIG. 7.

As determined through comparison between FIGS. 6 and 7, the gap 62 formed between the baffle plate 60 and the substrate placing table 4 allows the gas at the spots E and F to flow respectively in directions close to the directions of the shortest routes from the spots E and F to the edge of the substrate W. Thus, the gas flow patterns at the spots E and F become similar to those at the spots D and G (i.e., the pattern that the gas tends to flow in the direction of the shortest route from each spot to the edge of the substrate W). As such, by forming the gap 62 between the baffle plate 60 and the substrate placing table 4, the gas flow patterns at the spots located in the vicinity of the portions of the baffle plate 60 where no communication holes 65 are formed, such as the spots E and F, become similar to the gas flow patterns at the spots located in the vicinity of the portions of the baffle plate 60 where the communication holes 65 are formed, such as the spots D and G. Accordingly, it is possible to achieve uniformity of the gas flow at each spot on the substrate W.

In the above described embodiment, the temperatures of the baffle plate 60 and the substrate placing table 4 are adjusted to different temperatures. The temperature of the substrate placing table 4 is adjusted to a temperature required to regulate the substrate W to a predetermined temperature. The temperature of the baffle plate 60 is adjusted to a temperature at which a gas of reaction products generated during the substrate processing is kept from adhering thereto (i.e., to the reactant adherence preventing temperature). In the substrate processing apparatus 1, the gap 62 is formed between the baffle plate 60 and the substrate placing table 4 to thereby suppress thermal conduction between the baffle plate 60 and the substrate placing table 4. Thus, it is possible to maintain the temperature of the substrate placing table 4 (in particular, the adjacent portion to the baffle plate 60) at a predetermined temperature with a high degree of accuracy. In a case of depressurizing the inside of the processing chamber 3 as in the above embodiment, thermal conduction between the baffle plate 60 and the substrate placing table 4 is suppressed by so-called vacuum insulation.

Uniformity of the substrate processing process in the substrate processing apparatus 1 can be achieved by improving the uniformity of the gas flow on the surface of the substrate W and adjusting the temperature of the substrate W at a predetermined temperature with a high degree of accuracy. Further, the uniformly processed substrates W are carried into the heating apparatus 10 and then vaporization of the reaction products (heating process) is performed thereon. Thus, the removal of the reaction products on the substrates W after the above described chemical treatment is performed uniformly with a high degree of accuracy.

While some examples of the embodiments of the present disclosure have been described, the present disclosure is not limited thereto. It is obvious that those skilled in the art may easily make a variety of variations or modifications in the form of the embodiments described herein without departing from the scope and spirit of the disclosure as defined by the appended claims. It is considered that such forms also fall within the scope and spirit of the present disclosure.

For example, the substrate processing system S configured to load and process two sheets of the substrates W at a time has been described in the above embodiment, but the present embodiment is not limited thereto. The present embodiment is applicable to a substrate processing apparatus configured to process a plurality of sheets, for example, three, four or more sheets of the substrates W at a time. Also, the present embodiment is applicable to a substrate processing apparatus configured to process only one substrate W.

Further, in the above embodiment, the chemical treatment is explained as the substrate processing. However, the substrate processing apparatus according to the present disclosure may be applied to processing apparatuses for other processes, for example, a substrate processing apparatus for performing a plasma CVD process on a substrate.

Further, in the above embodiment, the process of performing the chemical treatment on the $SiO_2$ film formed on the substrate W by using the HF gas and the $NH_3$ gas serving as the process gases (i.e., the alteration process), and the process of performing the heating treatment on the processed substrate (i.e., the heating process) are described by way of example as the substrate processing. The chemical treatment and the heating treatment are explained to be conducted in the substrate processing apparatus 1 and the heating apparatus 10, respectively. However, the chemical treatment and the heating treatment may be conducted in the same processing apparatus (chamber). Specifically, it is also possible that, in one chamber, the process gases (the HF and $NH_3$ gases) are introduced, the substrate processing (i.e., the chemical treatment) is performed, the process gases are exhausted, and then the substrate is heated to remove the reaction products. The substrate processing apparatus according to the present disclosure may be used as an apparatus used in performing the two such processes in the same chamber.

The present disclosure is applicable to a substrate processing apparatus used in a micro fabrication field, for example, a semiconductor manufacturing process and the like.

According to the present disclosure in some embodiments, there is provided a substrate processing apparatus capable of securing a uniform gas flow on a substrate to thereby perform a uniform substrate processing.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus provided with a processing chamber configured to process a substrate and capable of being depressurized, the apparatus comprising:
    a substrate placing table configured to place a substrate thereon;
    a baffle plate disposed around the substrate placing table so as to divide an inside of the processing chamber into a processing space and an exhaust space; and
    an exhaust port configured to exhaust the inside of the processing chamber,
    wherein a gap configured to uniformly exhaust a processing gas is formed between the substrate placing table and the baffle plate and a plurality of communication holes having an identical diameter are formed in the baffle plate so that the processing space and the exhaust space communicate with each other,
    wherein no communication holes are formed in a portion of the baffle plate directly above the exhaust port,
    wherein the baffle plate includes a foot section elongated from an outer peripheral portion of the baffle plate along an inner wall of the processing chamber to a bottom surface of the processing chamber, and
    wherein the exhaust port is formed in the bottom surface of the processing chamber and is disposed at an inner side of the bottom surface of the processing chamber than the foot section in a radial direction.

2. The substrate processing apparatus of claim 1, wherein, among the plurality of communication holes formed in the baffle plate, a density of the communication holes located in the vicinity of the exhaust port is lower than a density of the communication holes located in other portions.

3. The substrate processing apparatus of claim 1, wherein temperatures of the substrate placing table and the baffle plate are adjusted to different temperatures from each other.

4. The substrate processing apparatus of claim 3, wherein the temperature of the substrate placing table is adjusted to a substrate processing temperature and the temperature of the baffle plate is adjusted to a reactant adherence preventing temperature which is higher than the substrate processing temperature.

5. The substrate processing apparatus of claim 1, wherein the exhaust port is disposed in an eccentric position from a center of the substrate placing table as viewed from above.

6. The substrate processing apparatus of claim 5, wherein a gate valve which is opened to carry the substrate into the processing chamber is installed in a location facing the exhaust port in a horizontal direction.

7. The substrate processing apparatus of claim 5, wherein, among the plurality of communication holes formed in the baffle plate, a density of the communication holes in a center portion of a part of the baffle plate facing the exhaust port with the substrate placing table interposed between the center portion and the exhaust port in a plan view is lower than a density of the communication holes in a peripheral portion of the part of the baffle plate.

* * * * *